United States Patent
Kang et al.

(10) Patent No.: US 9,853,039 B1
(45) Date of Patent: Dec. 26, 2017

(54) SPLIT-GATE FLASH CELL FORMED ON RECESSED SUBSTRATE

(71) Applicant: Cypress Semiconductor Corporation, San Jose, CA (US)

(72) Inventors: Sung-Taeg Kang, Palo Alto, CA (US); James Pak, Sunnyvale, CA (US); Unsoon Kim, San Jose, CA (US); Inkuk Kang, San Jose, CA (US); Chun Chen, San Jose, CA (US); Kuo-Tung Chang, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/473,372

(22) Filed: Mar. 29, 2017

Related U.S. Application Data

(60) Provisional application No. 62/433,556, filed on Dec. 13, 2016.

(51) Int. Cl.

| | |
|---|---|
| H01L 29/66 | (2006.01) |
| H01L 27/11565 | (2017.01) |
| H01L 27/11521 | (2017.01) |
| H01L 27/11526 | (2017.01) |
| H01L 27/11519 | (2017.01) |
| H01L 29/423 | (2006.01) |
| H01L 27/11568 | (2017.01) |
| H01L 27/11573 | (2017.01) |

(52) U.S. Cl.
CPC .. *H01L 27/11565* (2013.01); *H01L 27/11519* (2013.01); *H01L 27/11521* (2013.01); *H01L 27/11526* (2013.01); *H01L 27/11568* (2013.01); *H01L 27/11573* (2013.01); *H01L 29/42328* (2013.01); *H01L 29/42344* (2013.01)

(58) Field of Classification Search
CPC .................................................. H01L 27/11565
USPC ............................................ 257/319; 438/149
See application file for complete search history.

(56) References Cited

U.S. PATENT DOCUMENTS

| | | | |
|---|---|---|---|
| 5,556,797 A | 9/1996 | Chi et al. | |
| 6,090,668 A * | 7/2000 | Lin | ................... H01L 21/28273 257/E21.209 |

(Continued)

OTHER PUBLICATIONS

International Search Report for International Application No. PCT/US2017/046505 dated Oct. 19, 2017; 2 pages.

(Continued)

*Primary Examiner* — Jami M Valentine

(57) ABSTRACT

A semiconductor device including a non-volatile memory (NVM) cell and method of making the same are disclosed. The semiconductor device includes a metal-gate logic transistor formed on a logic region of a substrate, and the NVM cell integrally formed in a first recess in a memory region of the same substrate, wherein the first recess is recessed relative to a first surface of the substrate in the logic region. Generally, the metal-gate logic transistor further including a planarized surface above and substantially parallel to the first surface of the substrate in the logic region, and the NVM cell is arranged below an elevation of the planarized surface of the metal-gate. In some embodiments, logic transistor is a High-k Metal-gate (HKMG) logic transistor with a gate structure including a metal-gate and a high-k gate dielectric. Other embodiments are also disclosed.

19 Claims, 18 Drawing Sheets

(56) References Cited

U.S. PATENT DOCUMENTS

| | | | |
|---|---|---|---|
| 6,215,145 B1* | 4/2001 | Noble | H01L 27/115 |
| | | | 257/315 |
| 6,541,324 B1 | 4/2003 | Wang | |
| 6,893,921 B2 | 5/2005 | Ding | |
| 7,253,470 B1* | 8/2007 | Liu | H01L 21/28273 |
| | | | 257/316 |
| 8,035,156 B2 | 10/2011 | Winstead et al. | |
| 8,124,477 B2 | 2/2012 | Orita et al. | |
| 8,502,295 B2 | 8/2013 | Kim | |
| 9,276,006 B1 | 3/2016 | Chen et al. | |
| 9,349,741 B2 | 5/2016 | Liu | |
| 9,548,312 B1* | 1/2017 | Beyer | H01L 27/11524 |
| 9,583,640 B1* | 2/2017 | Richter | H01L 29/7887 |
| 2007/0232041 A1 | 10/2007 | Choi et al. | |
| 2009/0096009 A1 | 4/2009 | Dong et al. | |
| 2013/0207174 A1 | 8/2013 | Wang et al. | |
| 2015/0145022 A1 | 5/2015 | Chuang et al. | |
| 2015/0236110 A1 | 8/2015 | Wu et al. | |
| 2015/0263010 A1* | 9/2015 | Chuang | H01L 27/11534 |
| | | | 257/319 |
| 2016/0013197 A1 | 1/2016 | Liu | |
| 2017/0047336 A1* | 2/2017 | Zaka | H01L 27/11524 |

OTHER PUBLICATIONS

Written Opinion of the International Searching Authority for International Application No. PCT/US2017/046505 dated Oct. 19, 2017; 5 pages.

* cited by examiner

SPLIT-GATE FLASH CELL FORMED ON RECESSED SUBSTRATE

CROSS-REFERENCE TO RELATED APPLICATIONS

This application claims the benefit of priority under 35 U.S.C. 119(e) to U.S. Provisional Patent Application Ser. No. 62/433,556, filed Dec. 13, 2016, which is incorporated by reference herein in its entirety.

TECHNICAL FIELD

This disclosure relates generally to improved semiconductor device including a non-volatile memory cell formed on a recessed substrate and methods for making such a semiconductor device.

BACKGROUND

A split-gate cell is a type of flash or non-volatile memory (NVM) cell, in which a select gate is placed adjacent a memory gate, providing lower current during hot-carrier-based programming operation. During the programming of the split-gate cell, the select gate is biased at a relatively low voltage, and only the memory gate is biased at the high voltage to provide the vertical electric field necessary for hot-carrier injection. Since the acceleration of the carriers takes place in the channel region mostly under the select gate, the relatively low voltage on the select gate above that region results in more efficient carrier acceleration in the horizontal direction compared to the conventional memory cell. That makes the hot-carrier injection more efficient with lower current and lower power consumption during the programming operation. A split-gate cell may be programmed using techniques other than hot-carrier injection, and depending on the technique, any advantage over the conventional NVM memory cell during the programming operation may vary.

Fast read time is another advantage of the split-gate cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erase state at or below zero, the threshold voltage of the programmed state does not need to be very high while still providing a reasonable read margin between the erased and the programmed states. The resulting voltages applied to both the select gate and the memory gate in read operation are less than or equal to the supply voltage. Therefore, not having to pump the supply voltage to a higher level makes the read operation faster.

It is becoming increasingly common to monolithically incorporate multiple logic devices or transistors on the same substrate as the memory cells to provide improved efficiency, security, functionality, and reliability. However, incorporating logic devices on the same substrate along with the split-gate cell is challenging as each requires different fabrication parameters.

For example, one type of logic device that it is desirable to include with a semiconductor device having an embedded NVM memory employs metal-gate logic transistors for the logic devices. According to some methods, the metal-gate logic transistors are made using gate replacement process including one or more chemical mechanical polishing (CMP) steps in which an interlevel dielectric is planarized to expose a sacrificial gate that is then replaced by a metal-gate that is again planarized using a CMP process. However, due to gate height restrictions for the latest generation of metal-gate logic transistors at geometries of 28 nanometers and beyond, it is not possible to integrally form a flash memory cell on a single substrate with the logic transistors, since the taller gates of the flash memory cell devices would be damaged during the CMP process involved in forming the metal-gate.

Accordingly, there is a need for a semiconductor device integrating split-gate flash cells and metal-gate logic transistors on the same substrate and methods for making such a semiconductor device with improved performance, cost, and manufacturability.

SUMMARY

A semiconductor device and methods of manufacturing the same are provided. According to embodiments, the semiconductor device includes a non-volatile memory (NVM) cell and method of making the same are disclosed. The semiconductor device includes a metal-gate logic transistor formed in a logic region of a substrate, and the NVM cell integrally formed in a first recess in a memory region of the same substrate, wherein the first recess is recessed relative to a first surface of the substrate in the logic region. Generally, the logic transistor includes a metal-gate including a planarized surface above and substantially parallel to the first surface of the substrate in the logic region, and the NVM cell is arranged below an elevation of the planarized surface of the metal-gate.

According to one embodiment, the NVM cell includes a select gate and a memory gate, and top surfaces of the select gate and memory gate are below an elevation of the planarized surface of the metal-gate in the logic region. At least one of the top surfaces of the select gate and memory gate may include a silicide.

According to other embodiments, the semiconductor device includes a select gate is formed in a second recess in the first recess, the second recess having a second depth relative to the first surface of the substrate in the logic region greater than a first depth of the first recess. Optionally, the memory gate comprises a source junction recessed to the second depth.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
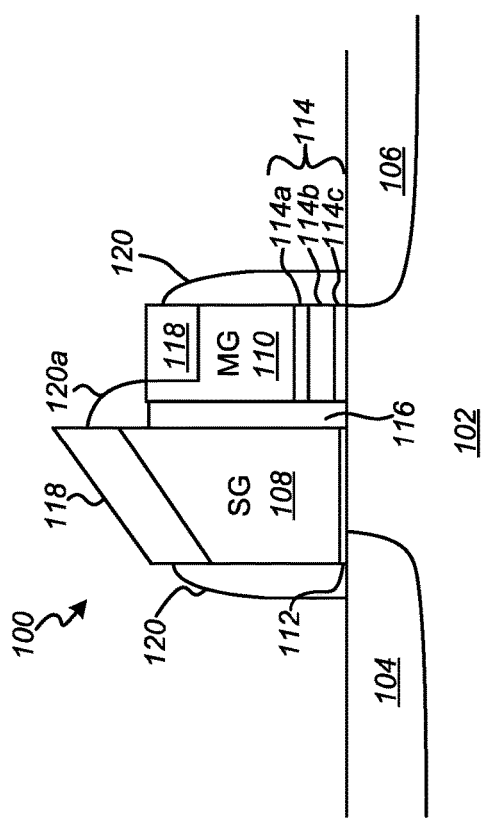
FIG. 1 depicts a cross-section of a memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the flash memory cell and logic devices are fabricated are mentioned. Although two different regions are described herein, it should be understood that any number of regions may exist on the substrate and may designate areas having certain, types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates an example of a non-volatile memory cell 100. Memory cell 100 is formed on a substrate 102, such as silicon. Substrate 102 is commonly p-type or a p-type well while a first doped source/drain junction 104 and a second doped source/drain junction 106 are n-type. However, it is also possible for substrate 102 to be n-type while junctions 104 and 106 are p-type.

Memory cell 100 includes two gates, a select gate 108 and a memory gate 110. Each gate may be a doped gate conductor layer formed by well known, for example, deposit and etch techniques to define the gate structure. Select gate 108 is disposed over a dielectric layer 112. Memory gate 110 is disposed over a charge storing or charge trapping dielectric 114 having one or more dielectric layers. In one example, charge trapping dielectric 114 includes a charge trapping silicon nitride layer 114b sandwiched between two silicon dioxide layers 114a, 114c to create a three-layer stack collectively and commonly referred to as "ONO." Other charge storing layer 114 may include a polysilicon layer 114b sandwiched between two dielectric layers 114a, 114c to create a floating gate floating-gate MOS field-effect transistor (FGMOS). A vertical dielectric 116 is also disposed between select gate 108 and memory gate 110 for electrical isolation between the two gates. In some examples, vertical dielectric 116 may include one or more of layers of the same dielectric as the charge trapping dielectric 114 and be formed concurrently therewith. In other examples, the vertical dielectric 116 can be formed from one or more dielectric layers or films having different dielectric properties. Junctions 104 and 106 are created by implanting dopants using, for example, an ion implantation technique. Junctions 104 and 106 form the source or drain of the split-gate transistor depending on what potentials are applied to each. In split-gate transistors, for convenience, junction 104 is commonly referred to as the drain, while junction 106 is commonly referred to as the source, independent of the relative biases. Self-aligned silicides or SALICIDEs 118 are formed over the surfaces of the memory gate 110 and select gate 108 to reduce resistance between the gates and contacts to the gates (not shown in this figure). It is to be understood that this description is meant to provide a general overview of common split-gate architecture and that, in actual practice, many more detailed steps and layers are provided to form the final memory cell 100.

The memory cell 100 further includes first sidewall spacer 120 surrounding both the select gate 108 and memory gate 110. In some embodiments, such as that shown in FIG. 1 the sidewall spacer 120 includes a second sidewall spacer or portion of the spacer 120a adjacent the sidewall of the select gate 108, and extending between the sidewall of the select gate and the top surface of the memory gate 110, to provide further isolation against shorts or leakage between the SALICIDE 118 formed on the top surface of the select gate and on the top surface of the memory gate.

An example write, read, and erase operation will now be described as it relates to memory cell 100. In order to write a bit in memory cell 100, a positive voltage on the order of 5 volts, for example, is applied to junction 106 while junction 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel junction between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to junction 106 while junction 104 is floated or at a certain bias, and select gate 108 and substrate 102 are typically grounded. A high negative voltage on the order of −8 volts, for example, is applied to memory gate 110. The bias conditions between memory gate 110 and junction 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and junction 104 in the range between zero and 3 volts, for example, while junction 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between junctions 104 and 106, then the memory cell holds a "low" bit and if the application of the low voltage during the "read" operation does not cause substantial current to flow between junctions 104 and 106, then the memory cell holds a "high" bit.

Figure 2:
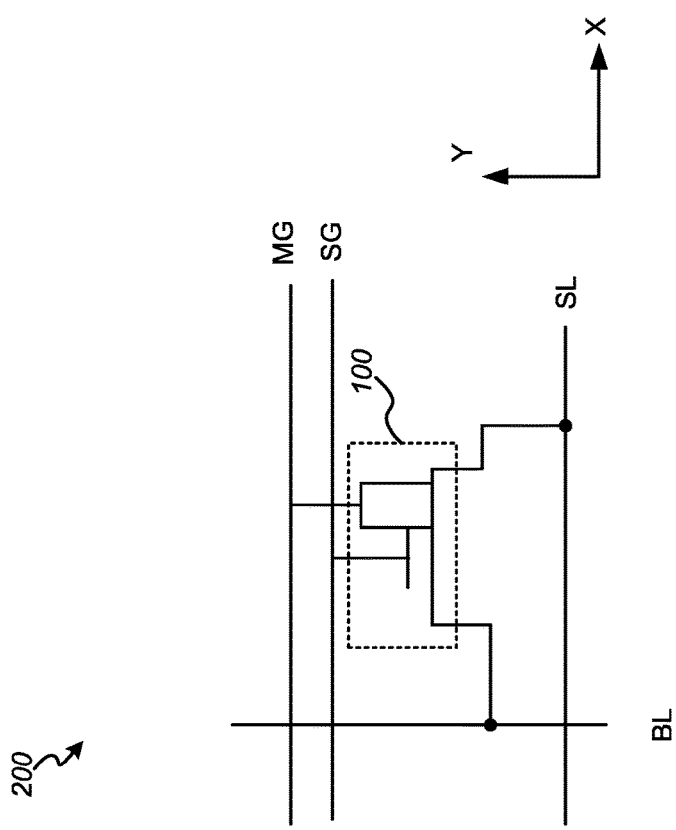
FIG. 2 is a circuit diagram of a memory cell in a memory array according to various embodiments.

FIG. 2 illustrates an example circuit diagram 200 that comprises a memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped junction 106 of each memory cell 100 along a row extending in the X direction.

An example bit line (BL) runs along the Y direction and is formed in a second metal layer (M2). Bit line (BL) may be used to make electrical connection with doped junction 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
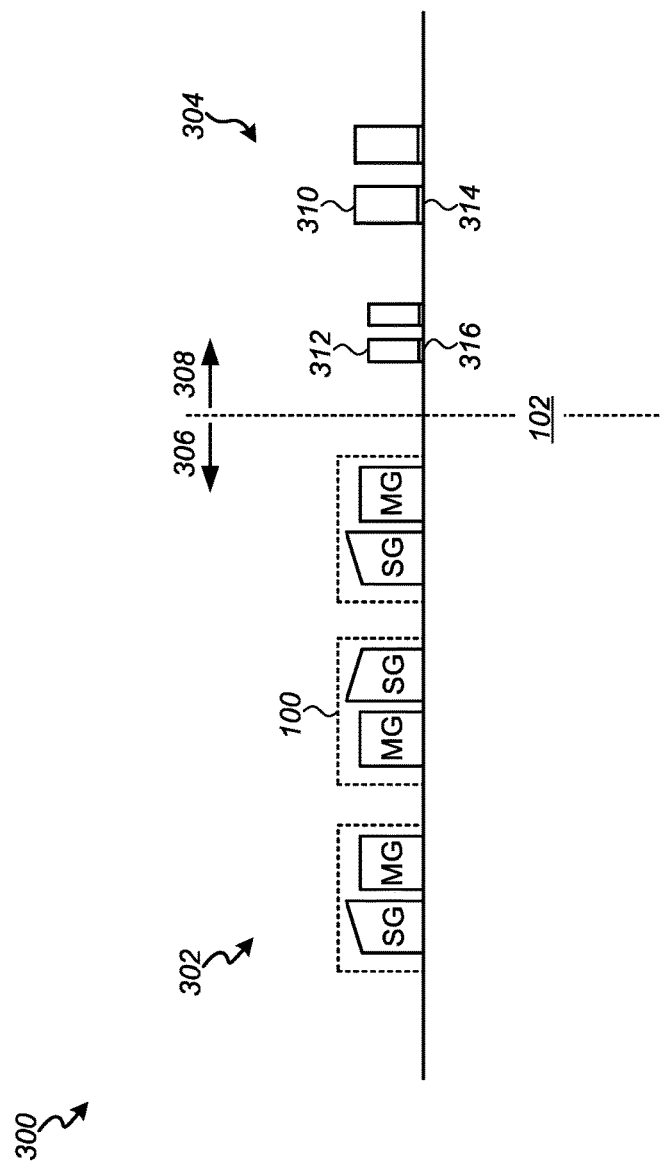
FIG. 3 depicts a cross-section of a semiconductor device according to various embodiments.

FIG. 3 illustrates an example semiconductor device 300 that includes both memory circuitry 302 and logic circuitry 304 in the same substrate 102. In this example, substrate 102 includes a core junction or memory region 306 and a periphery or logic region 308. Memory region 306 includes a plurality of memory cells 100 that may operate similarly to those previously described. It should be understood that the cross-section of FIG. 3 is only exemplary, and that memory region 306 and logic region 308 may be located in any area of substrate 102 and may be made up of various different regions. Furthermore, memory region 306 and logic region 308 may exist in the same general area of substrate 102.

Substrate 102, and indeed substrates in general as used throughout the description, can be silicon according to various embodiments. However, the substrate 102 may also be any of a wide array of semiconductor materials such as germanium, gallium arsenide, indium phosphide, etc. In other embodiments, the substrate 102 may be electrically non-conductive such as a glass or sapphire wafer.

Logic region 308 may include integrated circuit components such as resistors, capacitors, inductors, etc., as well as transistors. In the illustrated embodiment, logic region 308 includes a plurality of high-voltage transistors 310 and low-voltage transistors 312. In one example, high-voltage transistors 310 exist in a separate region of substrate 102 than low-voltage transistors 312. High-voltage transistors 310 are capable of handling voltages up to 20 volts in magnitude, for example, while low-voltage transistors 312 operate at a faster speed, but cannot operate at the same high voltages as high-voltage transistors 310. In an embodiment, low voltage transistors 312 are designed to have a shorter gate length than high voltage transistors 310. High-voltage transistors 310 are commonly characterized as having a thicker gate dielectric 314 than the gate dielectric 316 of low-voltage transistors 312. As shown in FIG. 3, low voltage transistors 312 have a narrower width than high-voltage transistors 310, but this need not be the case. According to some embodiments, low-voltage 312 transistors can be wider than high voltage transistors 310 or, alternatively, low-voltage transistors 312 and high-voltage transistors 310 can have the same width.

Figure 4:
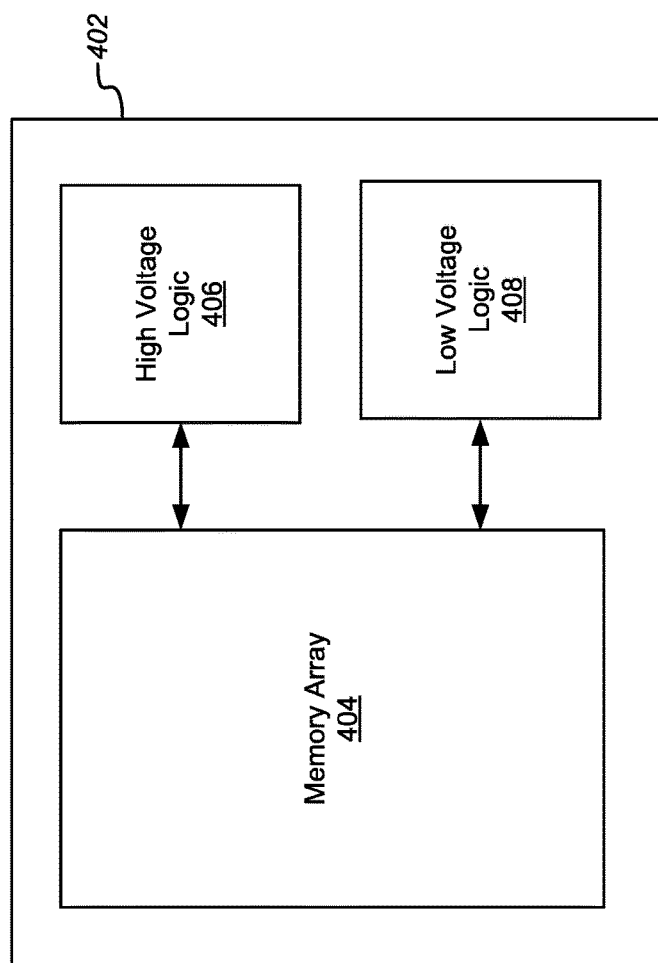
FIG. 4 is a functional block diagram of a memory device according to various embodiments.

FIG. 4 is a functional block diagram of a semiconductor device 402 according to embodiments of the present disclosure. As shown, semiconductor device 402 includes a memory array 404, high voltage logic 406, and low voltage logic 408. According to various embodiments, the memory array 404 may comprise a number of memory cells 100 and may be physically located in a logic region 308 of semiconductor device 402. High voltage logic 406 may comprise a number of high-voltage transistors 310, which can be used to control and/or drive portions of the memory array 404. Additionally, the high voltage logic 406 may be physically located in the logic region 308 of the semiconductor device 402. Similarly to the high voltage logic 406, the low voltage logic 408 may comprise a number of low voltage transistors 312, which can be used to control and/or drive portions of the memory array 404. The low voltage logic 408 may also be located in the logic region 308 of the semiconductor device. According to various embodiments, the high voltage logic 406 and the low voltage logic 408 are located in different portions of the logic region 308.

In the past, with elements having lateral dimensions or 40 nanometer and larger it has been possible to integrally form memory cells and transistors of the logic circuit on a single, substrate using standard photolithographic, etching and deposition techniques. However, as the lateral dimensions of circuit elements have continued to shrink it has become necessary to restrict heights of the circuit elements. In particular, the height of a high-k metal-gate (HKMG) of logic transistors made using a gate replacement process is restricted to 500 angstroms (Å) or less to ensure openings resulting from the etching of sacrificial gates are completely filled with metal. In accordance with the present disclosure, the substrate in memory region is recessed so that a chemical mechanical polishing or planarization (CMP) process used for logic gate replacement does not damage the taller gates of the memory cell.

FIGS. 5A-5E depict a cross-section of a portion of a semiconductor device including a metal-gate logic transistor and a memory cell formed in recesses in a substrate according to various embodiments of the present disclosure.

Figure 5A:
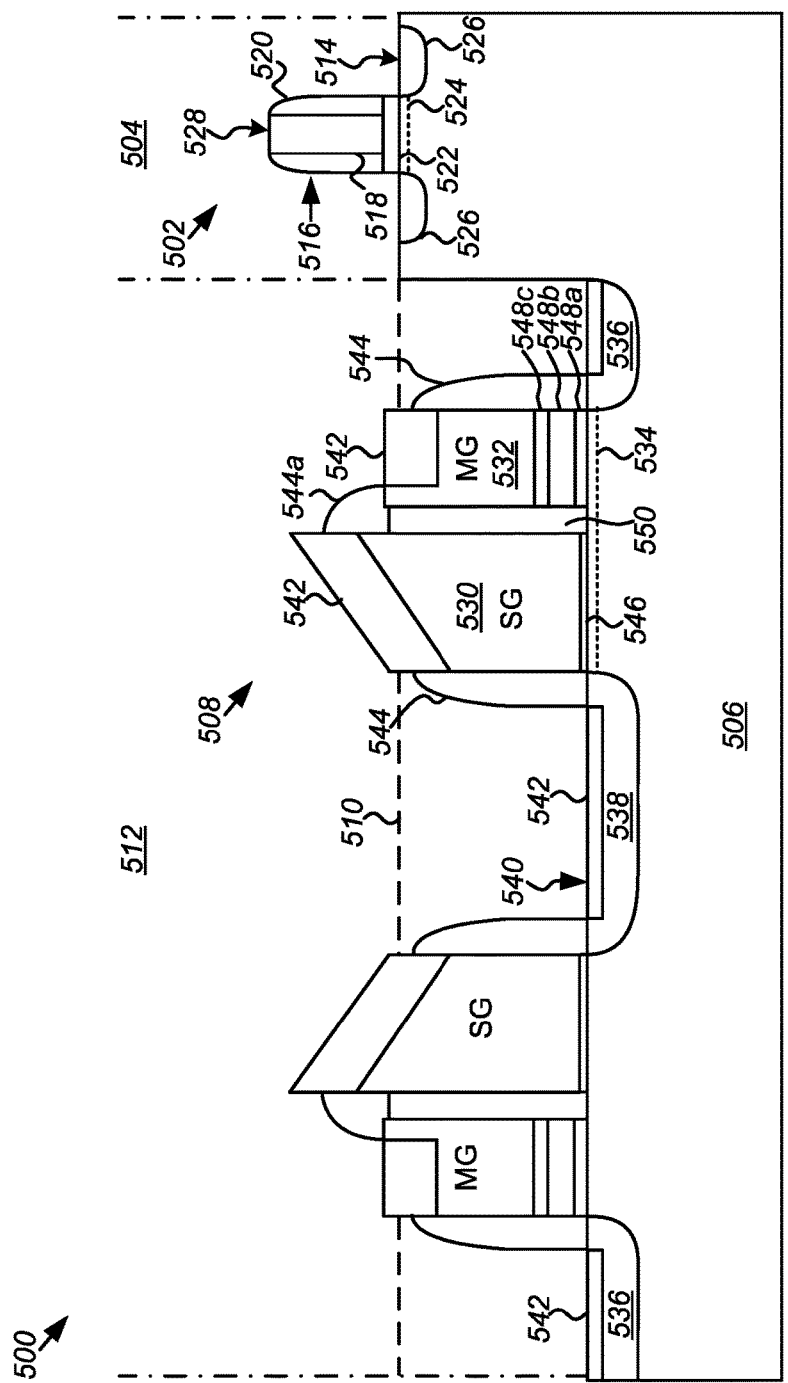
FIGS. 5A-5E depict a cross-section of a region of a semiconductor device including a HKMG logic transistor and a memory cell formed in recesses in a substrate according to various embodiments of the present disclosure.

Referring to FIG. 5A, in a first embodiment the semiconductor device 500 includes a metal-gate logic transistor 502 formed in a logic region 504 of a substrate 506, and a memory cell 508 formed in a recess 510 in the substrate in a memory region 512 of the substrate recessed relative to a first surface 514 of the substrate in the logic region. It is noted that the recess 510 is generally a contiguous and uniform in depth, in which all or substantially all of the memory cells 508 of a semiconductor device 500 including an array of multiple memory cells are formed. The memory cells 508 can have a split-cell architecture, as shown, or alternatively have a two transistor (2T) architecture, or architectures with a greater number of transistors.

In some embodiments, such as that shown, the logic transistor 502 is a High-k Metal-gate (HKMG) logic transistor with a gate structure 516 including a metal-gate 518 surrounded by one or more sidewall spacers 520 and a high-k gate dielectric 522 overlying a doped channel 524 separating source and drain (S/D) junctions 526 formed in or on the substrate 506. The metal-gate 518 can include any suitable metal or alloy, and can be formed either directly by deposition and patterning of a metal layer, or by a gate replacement process in which a metal is deposited in an opening following removal of a sacrificial gate formed in an interlevel dielectric (ILD). Suitable metals for the metal-gate 518 can include, but is not limited to, aluminum, copper, titanium, tungsten and alloys thereof. Suitable high-k dielectric material for the high-k gate dielectric 522 can include, but is not limited to, hafnium oxide, zirconium oxide, hafnium silicate, hafnium oxy-nitride, hafnium zirconium oxide and lanthanum oxide. Alternatively, the high-k gate dielectric 522 can include one or more layers suitable high-k dielectric material.

As a result of the process of forming the metal-gate 518, the logic transistor 502 further includes a planarized surface 528 on top of the metal-gate above and substantially parallel to the first surface 514 in the logic region 504 of the substrate 506. Thus, the memory cell 508 is formed below the elevation of the planarized surface 528 of the metal-gate 518 to avoid damage to gates of the memory cell from the CMP process. In the embodiment shown the memory cell 508, is a split-gate memory cell 508 and includes two gates, a select gate 530 and a memory gate 532 overlying a single, contiguous channel 534 separating a source junction 536 and drain junction 538 formed in a second surface 540 of the substrate 506. Optionally, as shown in this figure a silicide or self-aligned silicide (SALICIDE) 542 is formed on one or both of the top surfaces of the select gate 530, the memory gate 532 and the S/D junctions 536, 538 of the memory cell 508 to reduce resistance between the gates and S/D junctions, and contacts formed thereto (not shown in this figure).

The memory cell 508 further includes first sidewall spacers 544 surrounding both the select gate 530 and memory gate 532. In some embodiments, such as that shown in FIG. 5A, a difference in height between a top surface of the select gate 530 and the top surface of the memory gate 532 and the sidewall spacers 544 include a second sidewall spacer or portion of the spacer 544a adjacent the sidewall of the select gate 530, and extending between the sidewall of the select gate and the top surface of the memory gate 532, to provide isolation against shorts or leakage between the SALICIDE 542 formed on the top surface of the select gate and on the top surface of the memory gate. Although the sidewall spacers 544 and 544a are shown in FIG. 5A as being formed from or including a single layer of material, it will be appreciated that this need not be the case. According to some embodiments the second sidewall spacers 544 and 544a can include one or more layers of sequentially deposited dielectric materials, such as silicon oxides (SiO2), silicon nitride (SiN) and silicon oxynitride (SiN).

Generally, the recess 510 has a depth of from about 100 Å to about 1000 Å, and more preferably at least about 500 Å to avoid damage to the select gate 530 and memory gate 532. For example, in some embodiments in which the gate structure 516 of the logic transistor 502 is reduced by the CMP process to a height above the first surface 514 of the substrate 506 of about 500 Å, and the select gate 530 has a height above the second surface 540 of about 1000 Å, the recess 510 has a depth about 500 Å.

Each gate 530 and 532 may be a doped gate conductor layer formed, for example, from a polysilicon layer deposited and etched by well-known techniques to define the gate structures. In the embodiment shown, select gate 530 is disposed over a gate dielectric 546. Memory gate 532 is disposed over a charge trapping dielectric 548 having one or more dielectric layers, including a tunnel layer 548a, a blocking layer 548c and a charge trapping layer 548b sandwiched therebetween. In one example, the charge trapping dielectric 548 includes a nitride charge trapping layer 548b sandwiched between a silicon dioxide tunnel layer 548a and a silicon dioxide blocking layer 548c, to create a three-layer stack collectively and commonly referred to as "ONO." The nitride charge storage layer can include one or more layers of silicon nitride (SiN) or silicon oxynitride (SiON) including silicon, oxygen, and nitrogen in various stoichiometries to provide desired trap density and to locate a centroid of the trapped charge within the top of the nitride layer, further away from the substrate for a given charge storage layer thickness to improve charge retention. For example, in one embodiment the nitride layer can be a bilayer including an oxygen rich first SiN or SiON layer deposited on the lower dielectric layer, and an oxygen lean, silicon rich second SiN or SiON layer deposited on the first layer, which is trap dense. By oxygen-rich it is meant wherein a concentration of oxygen in the oxygen-rich first SiN or SiON layer is from about 15% to about 40%, whereas a concentration of oxygen in the oxygen-lean second layer is less than about 5%.

Other charge storage structures that may employed in the memory cell 508 include a polysilicon charge storage layer 548b sandwiched between the tunnel layer 548a and the blocking layer 548c, to form a floating gate of a floating gate memory transistor. The tunnel layer 548a and the blocking layer 548c can include one or more silicon oxide, silicon nitride, silicon oxynitride or high-k dielectric layers. Suitable high K dielectrics include aluminum oxide or hafnium based materials such as HfSiON, HfSiO or HfO, Zirconium based material such as ZrSiON, ZrSiO or ZrO, and Yttrium based material such as $Y_2O_3$.

The memory cell 508 further includes a spacer or intergate dielectric structure 550 disposed between select gate 530 and memory gate 532 for electrical isolation between the two gates. According to some embodiments the intergate dielectric structure 550 can include one or more layers of sequentially deposited dielectric materials, such as silicon oxides (SiO2), silicon nitride (SiN) and silicon oxynitride (SiN).

Figure 5B:
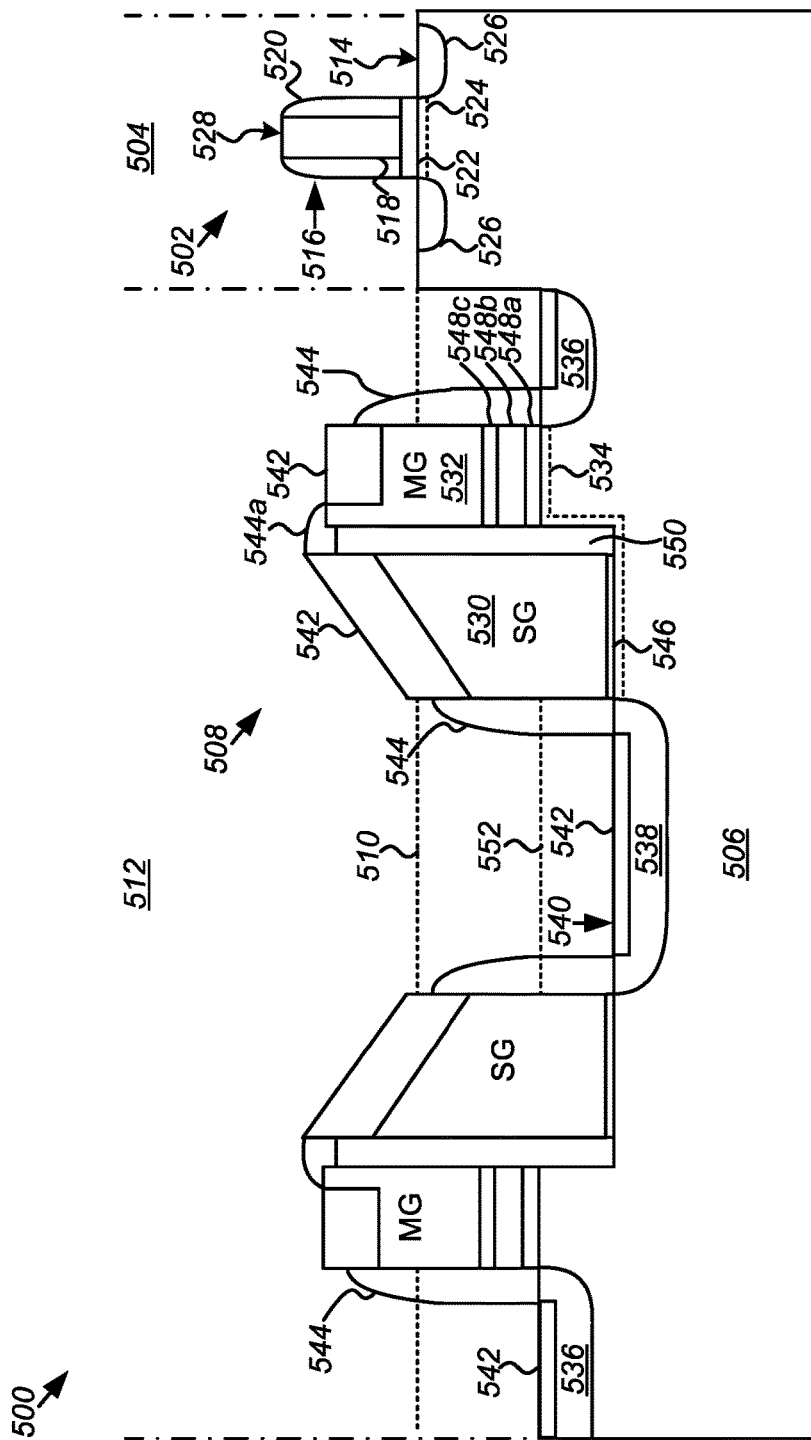

Referring to FIG. 5B, in a second embodiment the select gate 530 is formed in a second recess 552 in the first recess 510, the second recess 552 having a depth relative to the first surface 514 of the substrate 506 in the logic region 504 greater than the depth of the first recess. The memory gate 532 is formed solely in the first recess. Generally, the second recess 552 has a depth of from about 100 Å to about 1000 Å relative to the first surface 514 of the substrate 506 in the logic region 504, and more preferably at least about 500 Å to avoid damage to the select gate 530. The first recess 510 can have a depth of from about 100 Å to about 500 Å relative to the first surface 514 of the substrate 506 to avoid damage to the memory gate 532. For example, in embodiments in which the gate structure 516 of the logic transistor 502 has a height of about 500 Å, and the select gate 530 has a height above the second surface 540 of about 1000 Å, the second recess 552 can have a depth about 500 Å while the first recess 510 has a depth of from about 100 Å to about 400 Å.

Figure 5C:
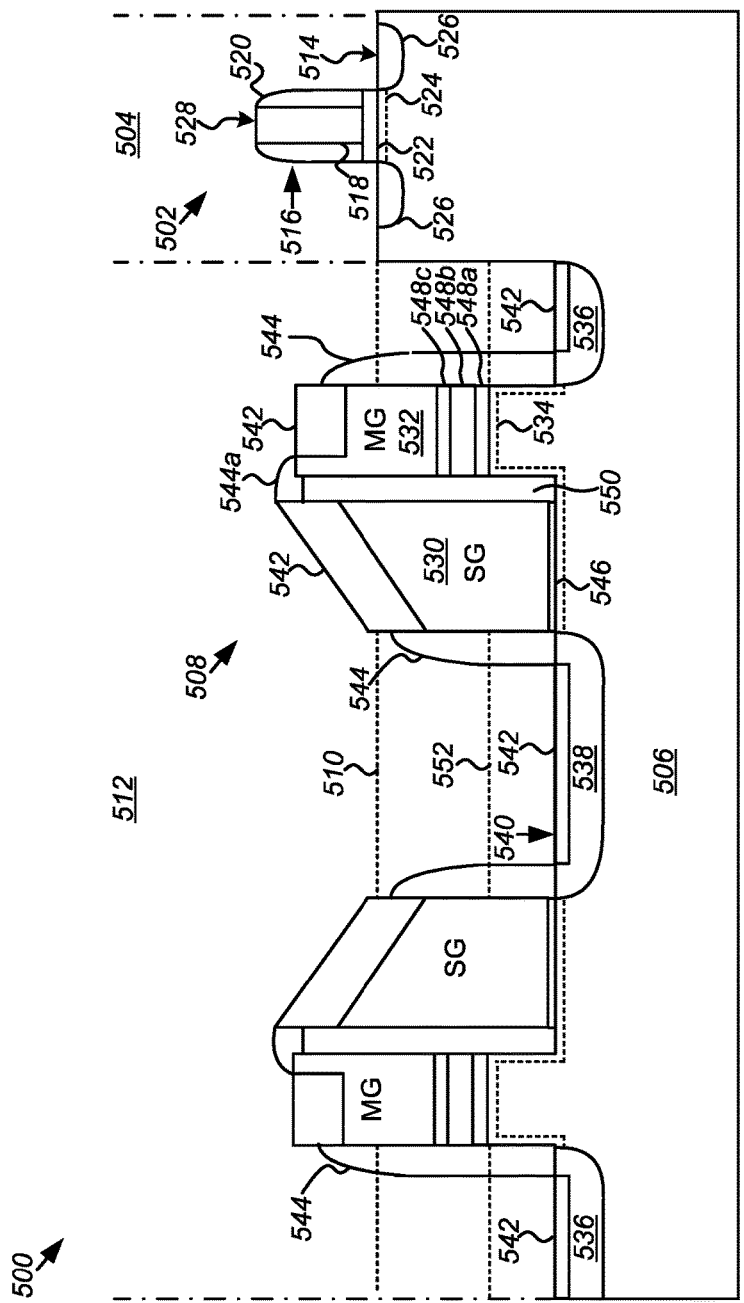

Referring to FIG. 5C, in a third embodiment the source junction 536 adjacent to the memory gate 532 is also formed in a second recess 552 recessed to the same depth as the select gate 530.

Figure 5D:
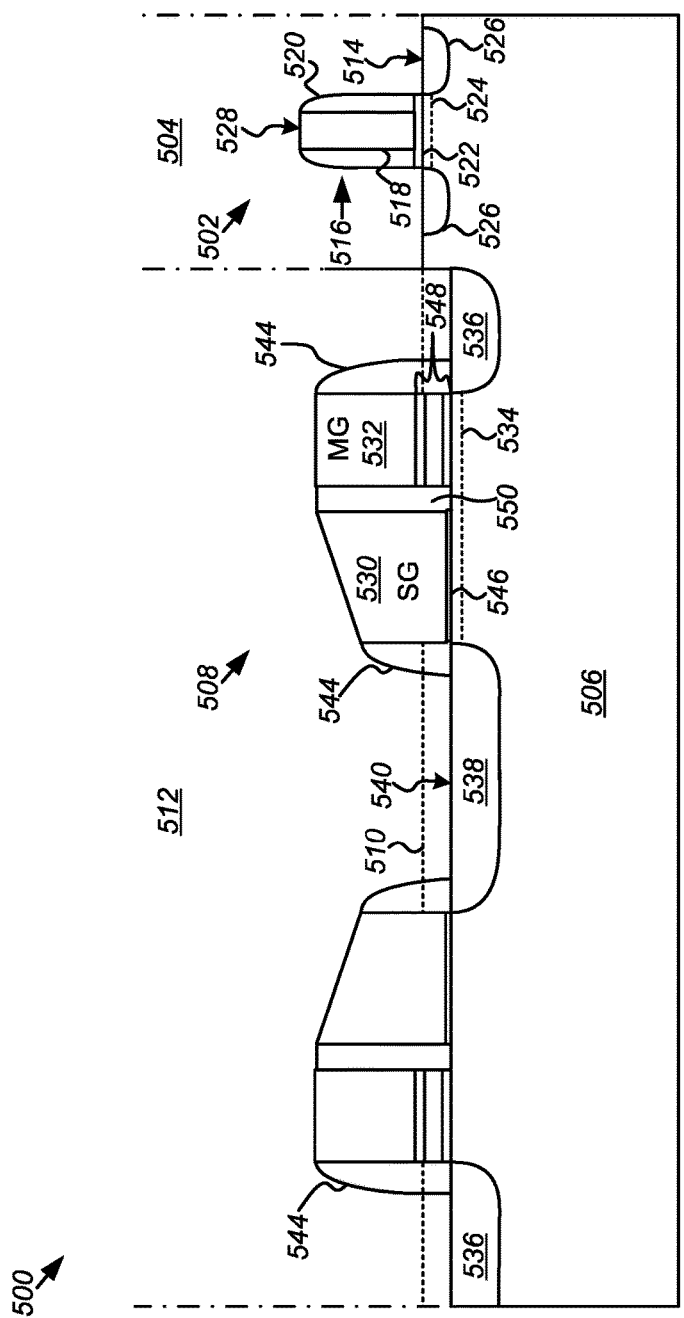

In another embodiment shown in FIG. 5D the structure of the semiconductor device 500 is similar to that shown in FIG. 5A, however heights of both the select gate 530 and memory gate 532 are significantly reduced, such that even though the depth of the first recess 510 is also reduced, the memory cell 508 is still formed sufficiently below the elevation of the planarized surface 528 of the gate structure 516 to avoid damage to gates of the memory cell from the CM' process. Optionally, in some versions of this embodiment, such as that shown, the silicide or self-aligned silicide is omitted from one or both of the top surfaces of the select gate 530 and memory gate 532 to further reduce the height of both the select gate and memory gate above the second surface 540 of the substrate 506. For example, in one embodiment in which the gate structure 516 of the logic transistor 502 has a height of about 500 Å, and the select gate 530 and memory gate 532 have a height above the second surface 540 of less than about 500 Å, and are formed in a recess 510 having a depth about 50 Å to about 100 Å.

Figure 5E:
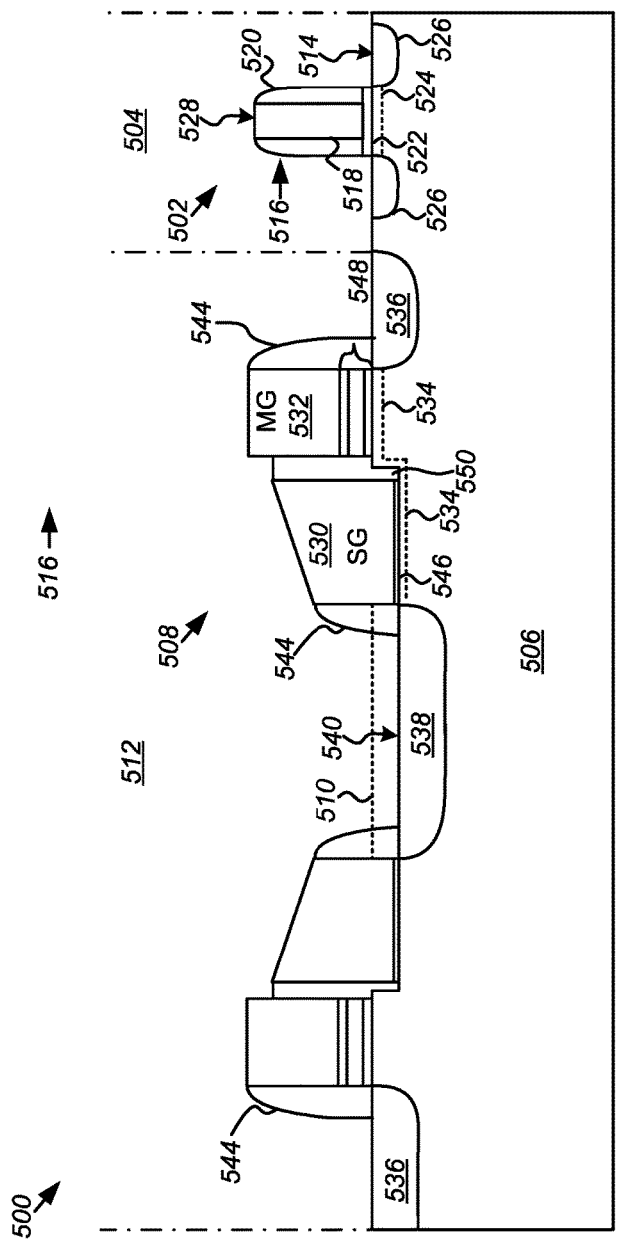

Finally, in yet another embodiment shown in FIG. 5E the heights of both the select gate 530 and memory gate 532 are significantly reduced and it is just the select gate that is formed in the first recess 510 while the memory gate is formed on the first surface 514, co-planar with the gate structure 516 of the logic transistor 502. For example, in one embodiment in which the gate structure 516 of the logic transistor 502 has a height of about 500 Å, the memory gate 532 has a height above the first surface 514 of 500 Å or less, while the select gate 530 has a height above the second surface 540 of from about 500 Å to about 550 Å and the first recess 510 has a depth about 50 Å to about 100 Å.

Figure 6A:
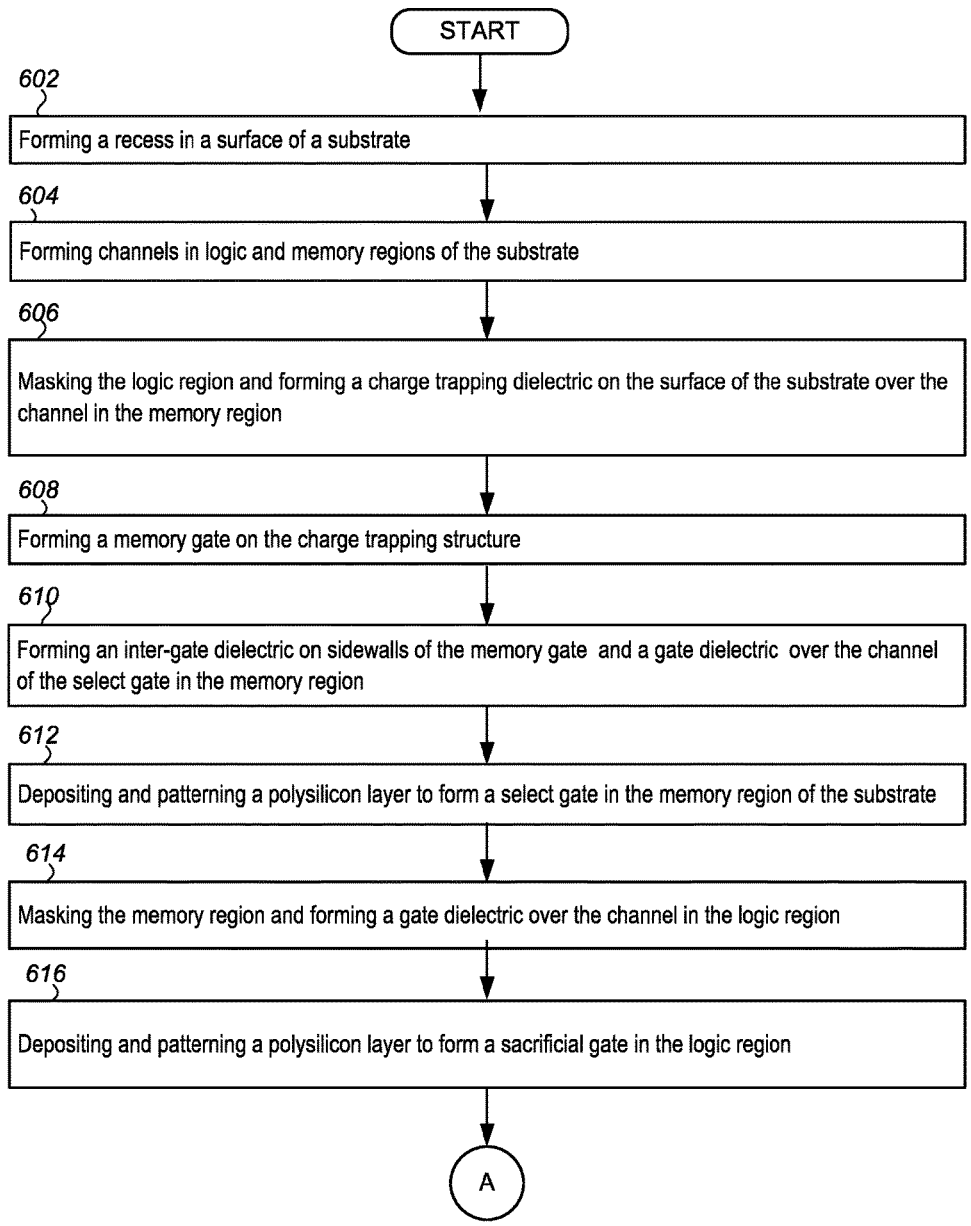
FIGS. 6A-6B is a flowchart depicting a method of manufacturing a semiconductor device according to various embodiments.
Figure 6B:
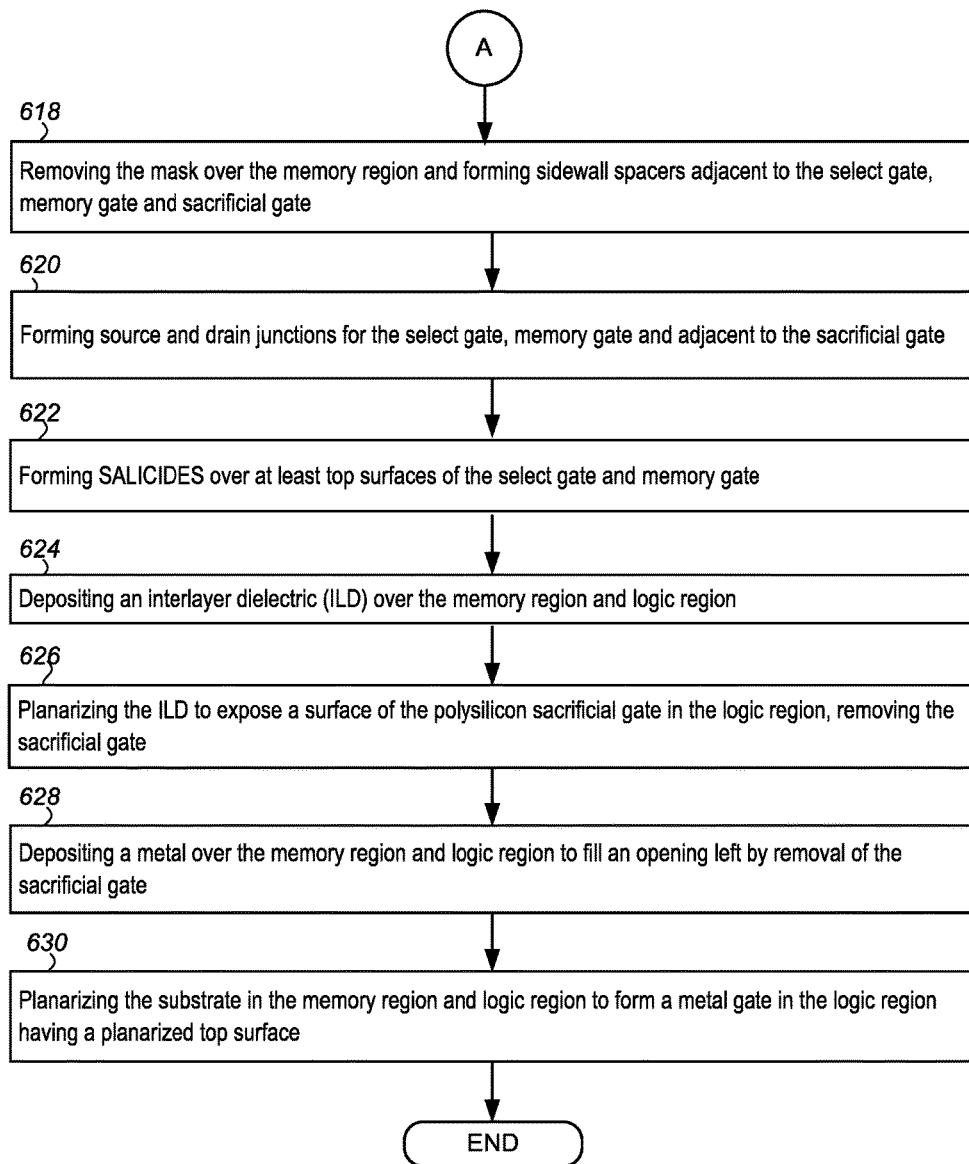
Figure 7A:
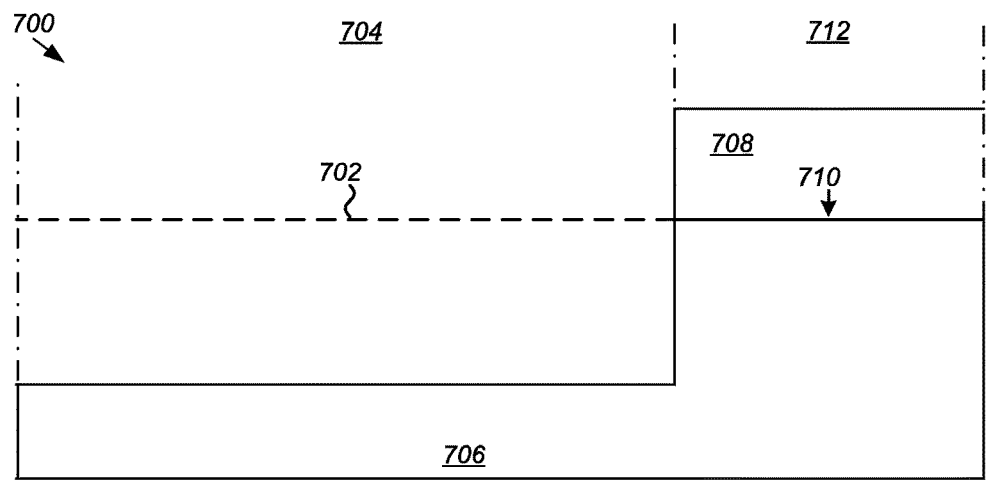
FIGS. 7A-7N depict a cross-section of a semiconductor device at various points during its manufacture according to the method of manufacturing of FIGS. 6A-6B.

An embodiment of a method for manufacturing a semiconductor device including a HKMG logic transistor and a split-gate memory cell formed in a recess in a substrate will now be described in detail with reference to FIGS. 6A through 6B and 7A through 7N. FIGS. 6A-6B is a flowchart illustrating an embodiment of a method or process flow. FIGS. 7A through 7N are block diagrams illustrating cross-sectional views of a portion of a semiconductor device 700 including a logic transistor and a split-gate memory cell formed in a recess during fabrication of the semiconductor device according to the method of FIGS. 6A-6B.

Referring to FIGS. 6A and 7A, the process begins with forming a recess 702 in a memory region 704 of a substrate 706 (step 602). In one embodiment, forming the recess 702 can be accomplished by forming a masking layer 708 over a first surface 710 of the substrate 706 in a logic region 712 of the substrate, and etching a surface (not shown) of the substrate in the memory region 704 to form the recess. The masking layer 708 can be formed using any known masking material including, for example, a photoresist or a silicon nitride hardmask, and patterned using known photolithographic techniques. The recess 702 can be formed using known wet or dry etching techniques compatible with the mask material and selective to the material of the substrate 706. For example, where the substrate is a bulk silicon substrate or includes a silicon layer in or on which the semiconductor device 700 is formed, the recess 702 can be formed using reactive ion etch (RIE), deep reactive ion etch (DRIE), or wet etching using an appropriate chemical such as potassium hydroxide (KOH), ethylenediamine pyrocatechol (EDP) or tetramethyl ammonium hydroxide (TMAH), as are known in the art.

Alternatively, the recess 702 can be formed in the memory region 704 by depositing one or more dielectric and/or semiconducting layers (not shown in these figures) in the logic region 712 of the substrate 706 in or on which a logic device will be subsequently formed. For example a silicon layer having a thickness of from about 100 to about 1000 Å can be deposited in the in the logic region 712 of the substrate 706 by chemical vapor deposition (CVD), molecular beam epitaxy (MBE) or atomic layer deposition (ALD).

Figure 7B:
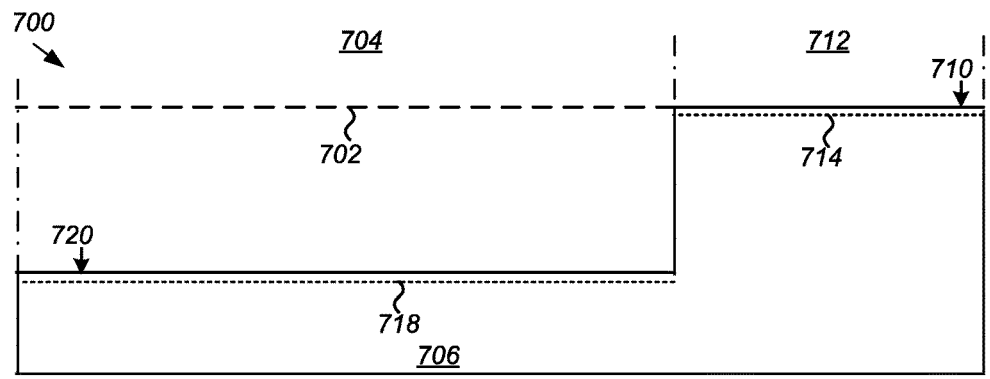

Referring to FIGS. 6A and 7B a doped channel 714 is formed in the surface 710 of the substrate 706 in the logic region 712, and a contiguous doped channel 718 formed in a second surface 720 of the substrate 706 in the memory region 704 (step 604). The channels 714, 718 and may be formed by implanting either P-type or N-type dopants using, for example, an ion implantation technique. For example, in one embodiment, both channels 714, 718, are formed by doping the surfaces 710, 720 of the substrate 706 with a P-type dopant, such as boron.

Figure 7C:
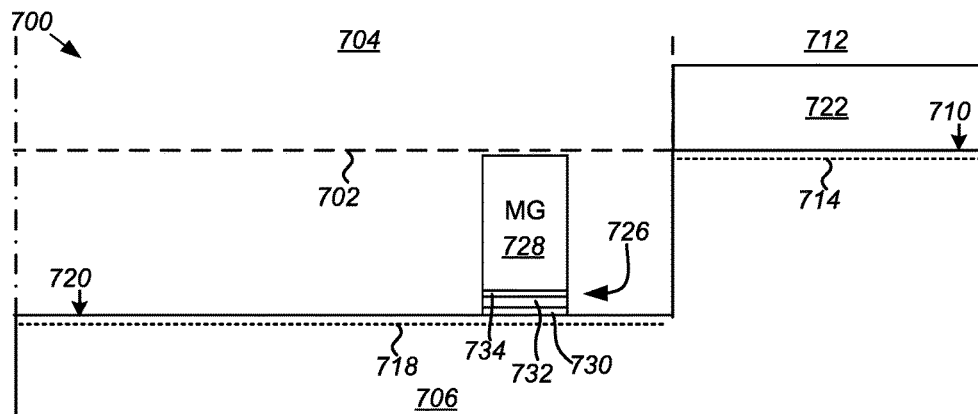

Next, referring to FIGS. 6A and 7C, another or second mask layer 722 is formed over the surface 710 of the substrate 706 in the logic region 712, a charge trapping dielectric 726 is formed on the surface 720 of the substrate 706 over one end of the contiguous channel 718 (step 606), and a memory gate 728 formed on the charge trapping dielectric (step 608). Generally, the charge trapping dielectric 726 is formed by sequentially depositing or forming over the surface 720 of the substrate 706 a tunnel layer 730, a charge trapping or storage layer 732, and a blocking layer 734. As noted above, the tunnel layer 730 can include a silicon oxide, such as $SiO_2$, either thermally grown or deposited by chemical vapor deposition CVD, plasma-enhanced CVD (PECVD) or atomic layer deposition (ALD). A suitable charge trapping layer 732 can include one or more layers of SiN or SiON, deposited by CVD, PECVD or ALD. A suitable charge-storage layer 732 a polysilicon floating gate charge-storage layer deposited by molecular beam epitaxy (MBE), ALD, and PECVD. The blocking layer 734 can include one or more layers of either a thermally grown or deposited $SiO_2$ and/or a high K dielectric deposited by CVD, PECVD or ALD.

The memory gate 728 can be formed by depositing a polysilicon gate layer over the layers of the charge trapping dielectric 726, and then forming a memory gate hardmask, for example, a thin silicon oxide layer or silicon nitride layer, over the polysilicon gate layer, patterning the memory gate hardmask using a photoresist and known photolithographic techniques, and then etching the polysilicon gate layer and layers of the charge trapping dielectric 726. For example, nitride layers can be etched using a known low pressure nitride etch at a moderate power (about 500 W) in a plasma of a fluorine containing gas, such as $CF_4$, or $CHF_3$; silicon dioxides can be either wet or dry etched; and polysilicon containing layers can dry etched using known polysilicon etch chemistries, such as $CHF_3$ or $C_2H_2$ or $HBr/O_2$. After the layers have been etched or patterned to form the memory gates 728 and charge trapping dielectric 726 shown in FIG. 7B, any remaining photoresist is stripped and a post resist strip wet clean performed.

Figure 7D:
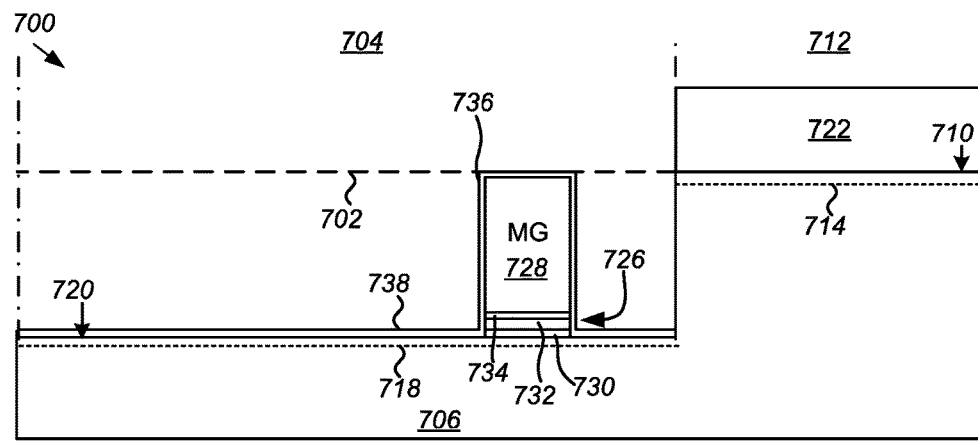

Referring to FIGS. 6A and 7D, a dielectric layer is deposited to form an inter-gate dielectric 736 adjacent to sidewalls of the memory gate 728 and the charge trapping dielectric 726 (step 610). In some embodiments, such as that shown, the dielectric layer deposited is an L-shaped layer including a first portion formed on or parallel to the sidewall of the memory gate 728 to form the inter-gate dielectric 736 and a second portion on over the surface 720 to concurrently form a gate dielectric 738 for a select gate of the memory cell. The dielectric layer can layer include one or more layers of silicon oxide, silicon nitride (SiN), or SiON, and can be deposited to form the inter-gate dielectric 736 and the gate dielectric 738 using any known oxide or nitride deposition processes.

Figure 7E:
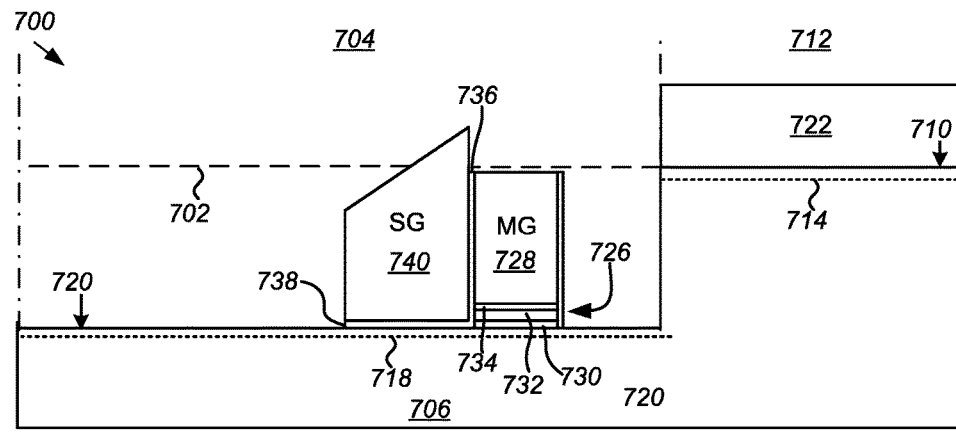

Next, referring to FIGS. 6A and 7E a select gate 740 is formed by depositing a polysilicon layer over the memory region 704 of the substrate, and then forming a select gate hardmask, for example, a thin silicon oxide layer or silicon nitride layer, over the polysilicon layer, and then etching the polysilicon layer to form the select gate (step 612). The polysilicon layer can dry etched, for example, using known polysilicon etch chemistries, such as $CHF_3$ or $C_2H_2$ or $HBr/O_2$. Optionally, as shown in FIG. 7E, any portion of the dielectric layer used to form the inter-gate dielectric 736 and gate dielectric 738 not underlying the select gate 740 or between the select gate and the memory gate 728 can also be removed at this time using any suitable oxide or nitride etch.

Figure 7F:
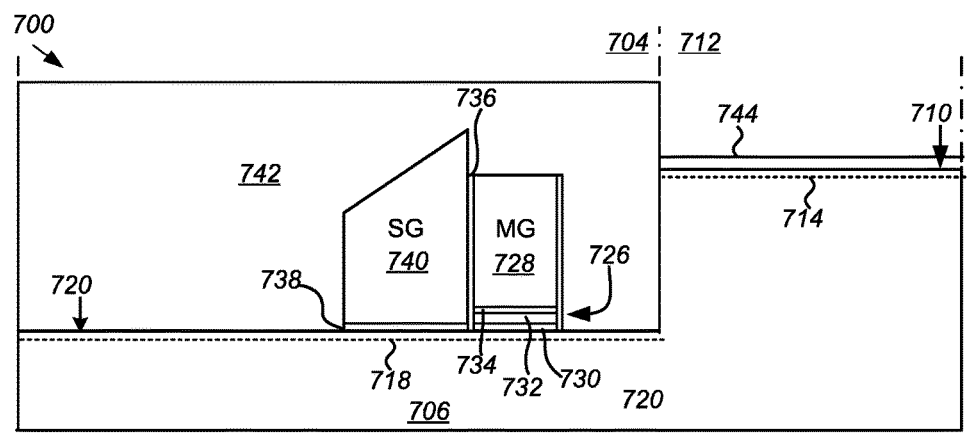

Referring to FIGS. 6A and 7F, the mask layer 722 over the logic region 712 is removed, another third mask layer 742 is formed over the surface 720 of the substrate 706 in the memory region 704, a gate dielectric 744 is formed overlying the doped channel 714 in the logic region of the substrate 706 (step 614). In some embodiments, the gate dielectric 744 is a high-k gate dielectric, and can include one or more layers of a suitable high-k dielectric material deposited by deposited by CVD, PECVD or ALD. Suitable high-k dielectric material for the high-k gate dielectric 744 can include, but is not limited to, hafnium oxide, zirconium oxide, hafnium silicate, hafnium oxy-nitride, hafnium zirconium oxide and lanthanum oxide.

Figure 7G:
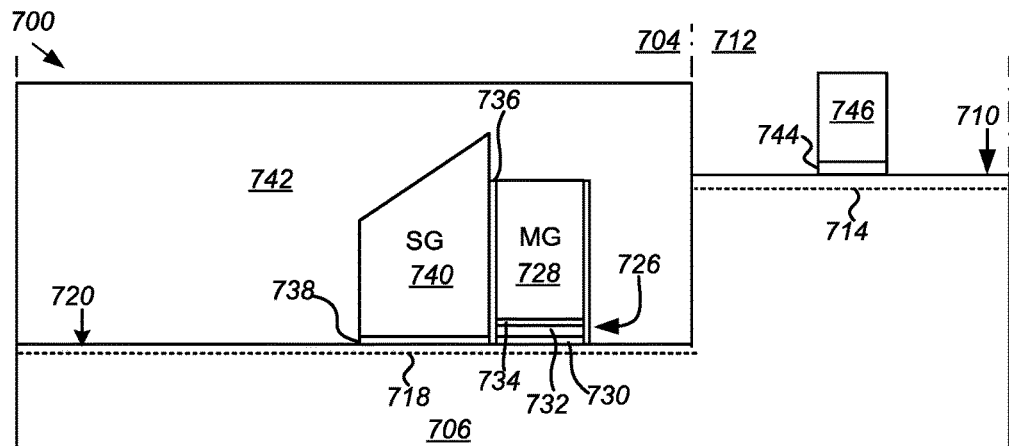

Next, a logic gate is formed over the channel 714 in the logic region 712. In some embodiments, the logic gate is metal-gate formed by a gate replacement process. Referring to FIGS. 6A and 7G, the gate replacement process begins with deposition and patterning of a polysilicon layer over the high-k gate dielectric 744 in the logic region 712 to form a sacrificial gate 746 (step 616). As with the memory gate 728 and select gate 740 formation described above, the polysilicon layer can be deposited using known deposition techniques, such as MBE, ALD, CVD or PECVD. A hardmask (not shown in this figure) is formed from a silicon oxide or silicon nitride layer and patterned using standard photolithographic techniques, and then the polysilicon layer is dry etched using known polysilicon etch chemistries, such as $CHF_3$ or $C_2H_2$ or $HBr/O_2$. Optionally, as shown in FIG. 7G, any portion of the dielectric layer used to form the gate dielectric 744 not underlying the sacrificial gate 746 can also be removed at this time.

Figure 7H:
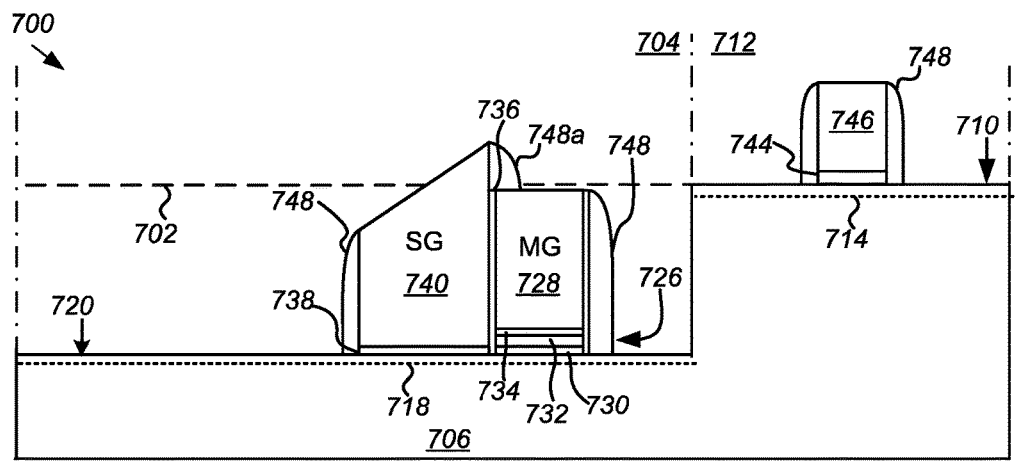

Referring to FIGS. 6B and 7H, the mask layer 742 over the surface 720 of the substrate 706 in the memory region 704 removed, and sidewall spacers 748 formed around the sacrificial gate 746, and adjacent to the select gate 740 and the memory gate 728 (step 618). Preferably, as in the embodiment shown, the second sidewall spacers 748 includes a spacer portion 748a adjacent the sidewall of the select gate 740, and between the sidewall of the select gate and a top surface of the memory gate 728, to provide further isolation against shorts or leakage between a SALICIDE subsequently formed on the top surface of the select gate and the SALICIDE on the top surface of the memory gate. Generally, the process for forming the sidewall spacers 748 can include deposition of a silicon nitride layer in a CVD furnace, followed by an anisotropic nitride spacer etch to substantially remove any silicon nitride from the surfaces 710, 720, of the substrate 706 to form the rounded sidewall spacers 748 shown in FIG. 7H.

Figure 7I:
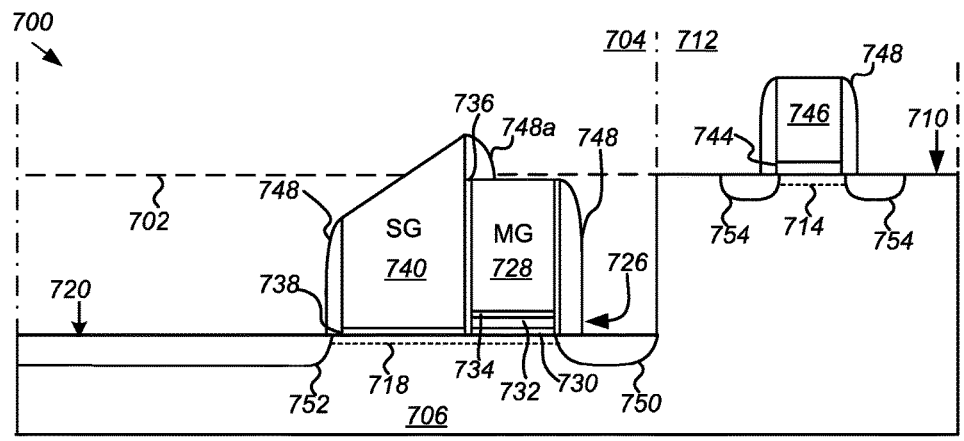

Next, referring to FIGS. 6B and 7I, source and drain (S/D) junctions are formed adjacent to the select gate 740, memory gate 728 and sacrificial gate 746 (step 620). The S/D junctions formed include a source junction 750 adjacent to the memory gate 728, a drain junction 752 adjacent to the select gate 740, and S/D junctions 754 adjacent to the sacrificial gate 746. It is noted that the drain junction 752 of the select gate 740 may be extended as shown, and so shared by a select gate of an adjoining memory cell in the memory region 704. Similarly, the source junction 750 of the memory gate 728 may be extended as shown, and so shared by a memory gate of an adjoining memory cell in the memory region 704, not adjacent to a boundary between the memory region 704 and logic region. Generally, the S/D junctions 750, 752, 754, may be formed by implanting either P-type or N-type dopants using, for example, an ion implantation technique. For example, P-type S/D regions can be formed by doping with boron, while N-type S/D regions can be doped with phosphorous or arsenic. Finally, it is noted that although the S/D junctions 750, 752, 754, are described in the embodiment shown as being formed at the same time, this need not be the case. Alternatively, of the S/D junctions 750, 752, 754, can be formed individually at separate times using single or multiple implants at any time after forming the memory gate 728, select gate 740 and sacrificial gate 746. Furthermore, the S/D junctions 750, 752, of the memory cell may or may not be shared among other memory cells in the memory region 704.

Figure 7J:
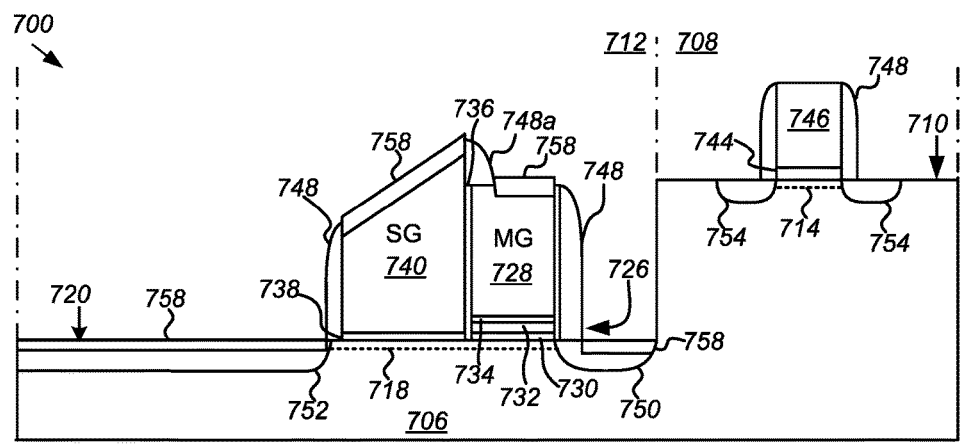

Referring to FIGS. 6B and 7J, a self-aligned silicide or SALICIDEs 758 are formed over at least the top surfaces of the memory gate 728 and select gate 740 (step 622). Optionally, as shown in this figure, additional SALICIDEs 758 are also formed on the S/D junctions 750, 752 of the memory cell to reduce resistance between the gates and S/D junctions, and subsequently formed contacts thereto. The silicide process may be any commonly employed in the art, including for example a pre-clean etch, metal deposition, anneal and wet strip.

Figure 7K:
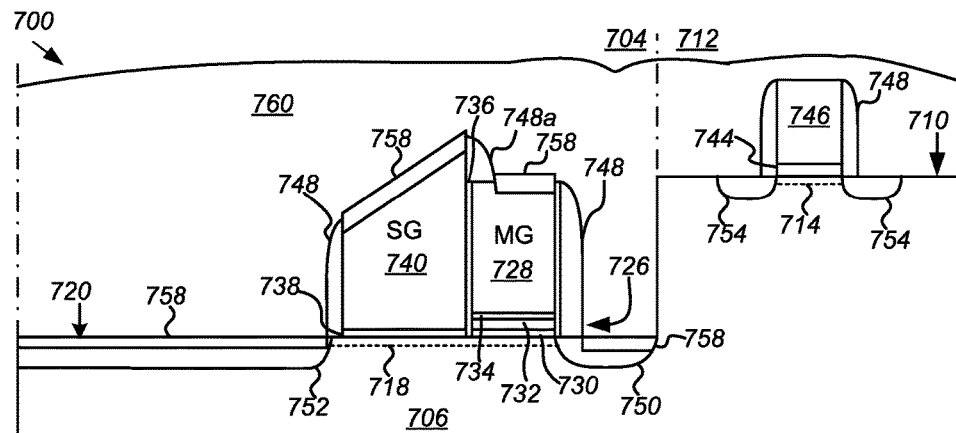
Figure 7L:
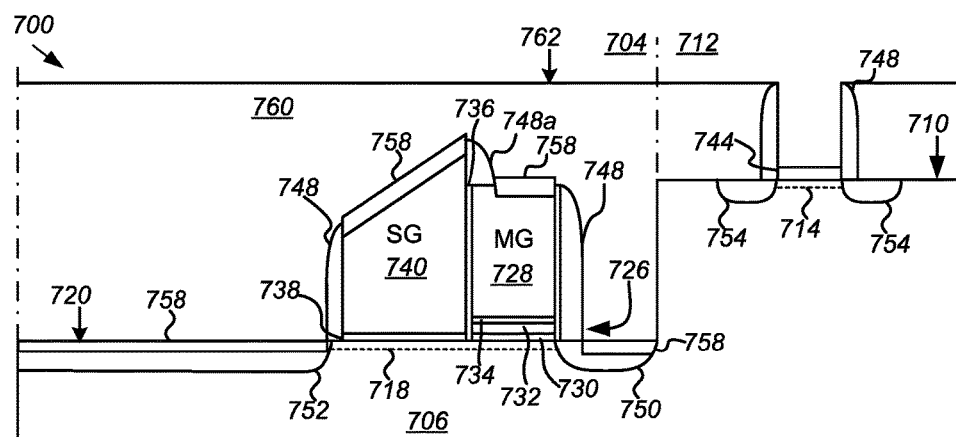

Referring to FIGS. 6B and 7K, an interlevel dielectric (ILD) layer 760 is deposited over both the memory and logic regions 704, 712 (step 624), and planarized using a CMP process to form a planarized surface 762 through which a top surface of the sacrificial gate 746 is exposed, and the sacrificial gate is removed, as shown in FIG. 7L (step 626). Generally, the ILD layer 760 can include any suitable dielectric material such as silicon dioxide (SiO$_2$), and can be deposited or formed using suitable, known deposition technique, including CVD. The polysilicon sacrificial gate 746 can be removed using known polysilicon etch chemistries, such as CHF$_3$ or C$_2$H$_2$ or HBr/O$_2$. It is noted that because the memory gate 728 and select gate 740 were formed in the recess 702, neither the SALICIDEs 758 nor the memory gate or select gate are damage in the CMP process.

Figure 7M:
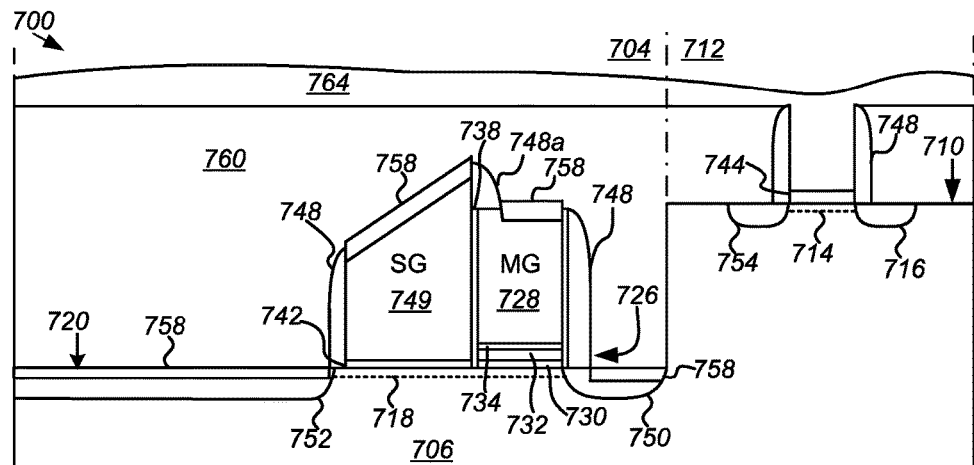
Figure 7N:
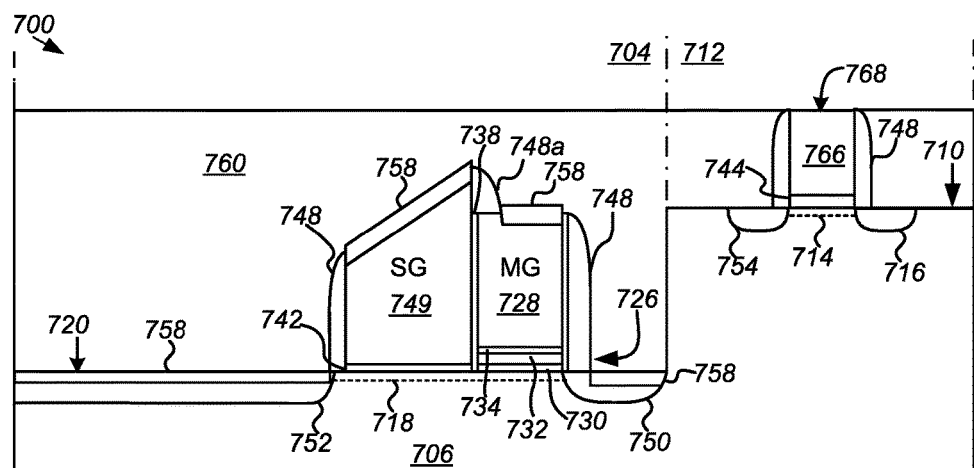

Next, referring to FIGS. 6B and 7M the opening in the ILD layer 760 resulting from the removal of the sacrificial gate 746 is filled with a metal by deposition of a metal layer 764 over both the memory and logic regions 704, 712 (step 628). Generally, the metal layer 764 can include any suitable metal such as aluminum, copper, titanium, tungsten and alloys thereof, and can be deposited or formed using suitable, known deposition technique, including CVD and physical vapor deposition (PVD), such as sputtering.

Finally, referring to FIGS. 6B and 7N the substrate is again planarized in a CMP process to remove the portions of the metal layer 764 not in the opening in the ILD layer 760 to form a metal-gate 766 having a planarized surface 768 (step 630).

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Thus, split-gate non-volatile memory cell having a memory gate and select gate separated by a multi-layer dielectric structure including a SiN/SiON dielectric layer and methods of making the same have been disclosed. Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor device comprising:
    a logic transistor formed on a logic region of a substrate; and
    a non-volatile memory (NVM) cell formed in a first recess in a memory region of the substrate, wherein the first recess is recessed relative to a first surface of the substrate in the logic region and wherein the NVM cell comprises a select gate and a memory gate,
    wherein the select gate is formed in a second recess in the first recess, the second recess having a second depth relative to the first surface of the substrate in the logic region greater than a first depth of the first recess.

2. The device of claim 1 wherein the logic transistor comprises a metal-gate including a planarized surface above and substantially parallel to the first surface of the substrate in the logic region.

3. The device of claim 2 wherein the NVM cell is arranged below an elevation of the planarized surface of the metal-gate.

4. The device of claim 2 wherein top surfaces of the select gate and memory gate are below an elevation of the planarized surface of the metal-gate.

5. The device of claim 4 wherein at least one of the top surfaces of the select gate and memory gate comprise a silicide.

6. The device of claim 1 wherein the memory gate comprises a source junction recessed to the second depth.

7. The device of claim 4 wherein the elevation of the planarized surface of the metal-gate is at least half an elevation of the top surface of the select gate above a second surface of the substrate in the in the first recess in which the select gate and memory gate are formed.

8. The device of claim 1 wherein the NVM cell comprises a two-transistor (2T) architecture.

9. The device of claim 1 wherein the NVM cell comprises a split-gate architecture.

10. The device of claim 1 wherein the logic transistor comprises a high-k gate dielectric.

11. The device of claim 1 wherein the memory gate comprises a charge-trapping dielectric layer.

12. The device of claim 1 wherein the memory gate comprises a floating gate comprising a polysilicon charge-storage layer.

13. A semiconductor device comprising:
a logic transistor formed on a logic region of a substrate, the logic transistor comprising a metal-gate including a planarized surface above and substantially parallel to a first surface of the substrate in the logic region; and
a non-volatile memory (NVM) cell comprising a select gate and a memory gate formed on a surface in a memory region of the substrate, wherein the memory region of the substrate is recessed to a first depth relative to the substrate in the logic region, and top surfaces of the select gate and memory gate are below an elevation of the planarized surface of the metal-gate, wherein at least one of the top surfaces of the select gate and memory gate comprise a silicide.

14. The device of claim 13 wherein the select gate is formed in a sub-region of the memory region having a second depth relative to the first surface of the substrate in the logic region that is greater than the first depth.

15. The device of claim 14 wherein the memory gate comprises a source junction recessed to the second depth.

16. The device of claim 13 wherein the elevation of the planarized surface of the metal-gate is at least half an elevation of the top surface of the select gate above a second surface of the substrate in the memory region.

17. The device of claim 13 wherein the logic transistor further comprises a high-k gate dielectric.

18. The device of claim 13 wherein the NVM cell comprises a two-transistor (2T) architecture.

19. A semiconductor device comprising:
a logic transistor formed on a logic region of a substrate, the logic transistor comprising a metal-gate including a planarized surface above and substantially parallel to a first surface of the substrate in the logic region; and
a non-volatile memory (NVM) cell comprising a select gate and a memory gate formed in a memory region of the substrate, the memory gate formed in a first recess in the memory region recessed to a first depth relative to the first surface of the substrate in the logic region, and the select gate formed in a second recess in first recess recessed to a second depth relative to the first surface that is greater than the first depth,
wherein top surfaces of the select gate and memory gate comprise a silicide and are below an elevation of the planarized surface of the metal-gate above the first surface of the substrate.

* * * * *